(12) United States Patent
You

(10) Patent No.: US 8,878,216 B2
(45) Date of Patent: Nov. 4, 2014

(54) LIGHT EMITTING DIODE MODULE AND METHOD FOR MANUFACTURING THE SAME

(75) Inventor: Jae Sung You, Su won-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/558,015

(22) Filed: Jul. 25, 2012

(65) Prior Publication Data

US 2013/0049047 A1     Feb. 28, 2013

(30) Foreign Application Priority Data

Jul. 26, 2011   (KR) ........................ 10-2011-0074223

(51) Int. Cl.
*H01L 33/00*       (2010.01)
*H01L 21/76*       (2006.01)
*H01L 21/00*       (2006.01)
*H01L 33/48*       (2010.01)
*H01L 33/54*       (2010.01)

(52) U.S. Cl.
CPC .............. *H01L 33/486* (2013.01); *H01L 33/54* (2013.01); *H01L 2924/0002* (2013.01); *H01L 2933/005* (2013.01)
USPC ........ 257/98; 257/99; 257/100; 257/E23.073; 257/E33.032; 257/E21.499; 438/424; 438/27; 438/29

(58) Field of Classification Search
CPC ..................... H01L 33/00; H01L 2924/12014; H01L 2924/0002; H01L 33/486; H01L 33/54; H01L 33/56; H01L 33/53; H01L 33/60; H01L 33/20; H01L 33/62; H01L 33/64; H01L 33/647; H01L 33/44; H01L 33/48; H01L 21/76244; H01L 21/76; H01L 2933/005
USPC .................. 257/98, 89, 95, 99, 100, E33.073, 257/E33.032, E21.499, E33.057, E33.055, 257/E33.056, E33.068; 428/424, 27, 29
See application file for complete search history.

(56) References Cited

U.S. PATENT DOCUMENTS

2010/0264439 A1   10/2010   Chen et al.
2012/0193659 A1*   8/2012   Andrews et al. ................ 257/98

FOREIGN PATENT DOCUMENTS

JP       2009-049239          3/2009
KR    10-2009-0051863 A       5/2009
WO    WO 2006109113 A2 *     10/2006   .............. H01L 33/00

* cited by examiner

*Primary Examiner* — Julio J Maldonado
*Assistant Examiner* — Moazzam Hossain
(74) *Attorney, Agent, or Firm* — McDermott Will & Emery LLP

(57) ABSTRACT

A light emitting diode (LED) module includes a substrate, an LED disposed on the substrate, a phosphor layer disposed on the LED, and a lens disposed on the substrate. The substrate has a recess defined therein. The lens is fastened to the substrate through the recess. A manufacturing method for the LED includes forming the recess in the substrate, mounting the LED on the substrate, forming the phosphor layer on the LED, and forming the lens directly on the substrate such that the lens is fastened to the substrate through the recess.

15 Claims, 11 Drawing Sheets

LIGHT EMITTING DIODE MODULE AND METHOD FOR MANUFACTURING THE SAME

CROSS-REFERENCE TO RELATED APPLICATION

This U.S. non-provisional application claims benefit of priority to Korean Patent Application No. 10-2011-0074223, filed on Jul. 26, 2011, in the Korean Intellectual Property Office, the entire contents of which are hereby incorporated by reference.

BACKGROUND

1. Field

The present disclosure relates to a light emitting diode (LED) module and a manufacturing method for the LED module, and more particularly, to an LED module having an improved lens connection structure and an increased reliability, and a manufacturing method for the LED module.

2. Description of the Related Art

A light emitting diode (LED) refers to a semiconductor device that emits light when a current flows. Due to a long lifespan, low power consumption, a high response rate, and excellent initial driving characteristics, the LED is widely applied to various fields including a lighting apparatus, an electric sign, and a back light unit of a display device, and the like.

In recent times, the LED is being used as a light source in various colors. With an increase in demands for a high output and high luminance LED, researches have been done actively on increasing performance and reliability of an LED package. To increase performance of an LED product, it is desired to provide not only an LED having a high optical efficiency, but also an LED package efficiently extracting light, and having a high color purity and uniform characteristics of products.

Factors such as color, light velocity and distribution of light intensity may determine characteristics of the LED. The characteristics of the LED may be determined primarily, by compound semiconductor materials used for the LED, and secondarily by a phosphor application method and a package structure.

LED chips, which purport to improve characteristics determined by the primary factors, have been developed rapidly. However, as the development related to the primary factors is currently slowing down, improvement of characteristics determined by the secondary factors is necessary to improve the light velocity and the light intensity distribution. In addition, high reliability of the LED package is in demand.

A phosphor is disposed on a blue LED or an ultraviolet (UV) LED to obtain white light using the LED. A white LED may produce white light by performing a partial color conversion of light extracted from the UV or blue LED through combination of red, green, blue, and yellow phosphors, and then mixing the color-converted light.

The LED may be manufactured in a form of a package or a module to be a product. First, an LED package is prepared by mounting an LED chip on a lead frame and a ceramic substrate, mixing and applying a phosphor according to a desired application, and forming a lens. Next, the LED package is cut into unit LED packages and a unit LED package is mounted on a printed circuit board (PCB), thereby achieving a modularized LED.

The foregoing modularizing structure, in which the LED package is mounted on the PCB, has a limited effect on minimizing of an LED module size. As the mounting is performed two times or more, the inferiority rate may increase, thereby reducing the price of the LED module. In addition, deviations may occur in luminance and color of the LED package due to various factors. The various factors include deviations of luminance and wavelength of the LED, a tolerance in manufacturing a structure such as a lead frame, and a tolerance in processing such as phosphor application and lens formation.

Therefore, to increase uniformity of optical characteristics such as luminance and color of the LED module as a resultant product, LEDs having various luminances and colors are grouped by binning and the respective binned LEDs are combinedly used.

However, when the deviations of luminance and color are great, even by binning of the LEDs, the deviations are not reduced or removed. Therefore, binning groups of the LEDs are determined within a range that does not cause the optical deviation of the LED module. That is, LEDs not included in the determined binning groups are unusable. Accordingly, yield is decreased and the manufacturing cost of producing the LED module is increased.

As a consequence, rather than the package type, a chip-on-board (COB) type module, in which the LED is mounted directly on a module substrate, is manufactured in recent times. The LED module manufactured in the COB type may reduce the manufacturing cost while increasing heat radiation efficiency by shortening a heat transfer path. However, when a lens is provided to the module substrate, the lens may be separated. Hence, there is still room for improvement, for example, in terms of reliability in a lens connection structure of an LED module.

SUMMARY

An aspect of the present disclosure encompasses an LED module including a substrate having a recess defined therein, an LED disposed on the substrate, a phosphor layer disposed on the LED, and a lens disposed on the substrate and fastened to the substrate through the recess.

Another aspect of the present disclosure relates to a manufacturing method for an LED, including forming a recess in a substrate, mounting an LED on the substrate, forming a phosphor layer on the LED, and forming a lens directly on the substrate such that the lens is fastened to the substrate through the recess.

In still another embodiment, a manufacturing method for an LED includes forming a recess in a substrate, mounting an LED on the substrate, forming a phosphor layer on the LED, disposing a lens on the substrate, and filling the recess with a lens forming material such that the disposed lens is fastened to the substrate with the lens forming material filling the recess.

The substrate may have a plurality of the recesses formed therein. The plurality of recesses may extend along edges of the substrate. The plurality of recesses may be formed at corners of the substrate. The plurality of recesses may have an identical shape. The plurality of recesses may have different shapes. Each of the plurality of recesses may have a polygonal shape, an L-shape, or a circular shape.

BRIEF DESCRIPTION OF THE DRAWINGS

The foregoing and other features of the present disclosure will be apparent from more particular description of embodiments of the present disclosure, as illustrated in the accompanying drawings in which like reference characters may refer to the same or similar parts throughout the different views. The drawings are not necessarily to scale, emphasis instead being placed upon illustrating the principles of the embodiments of the present disclosure. In the drawings, the thickness of layers and regions may be exaggerated for clarity.

DETAILED DESCRIPTION

Figure 1:
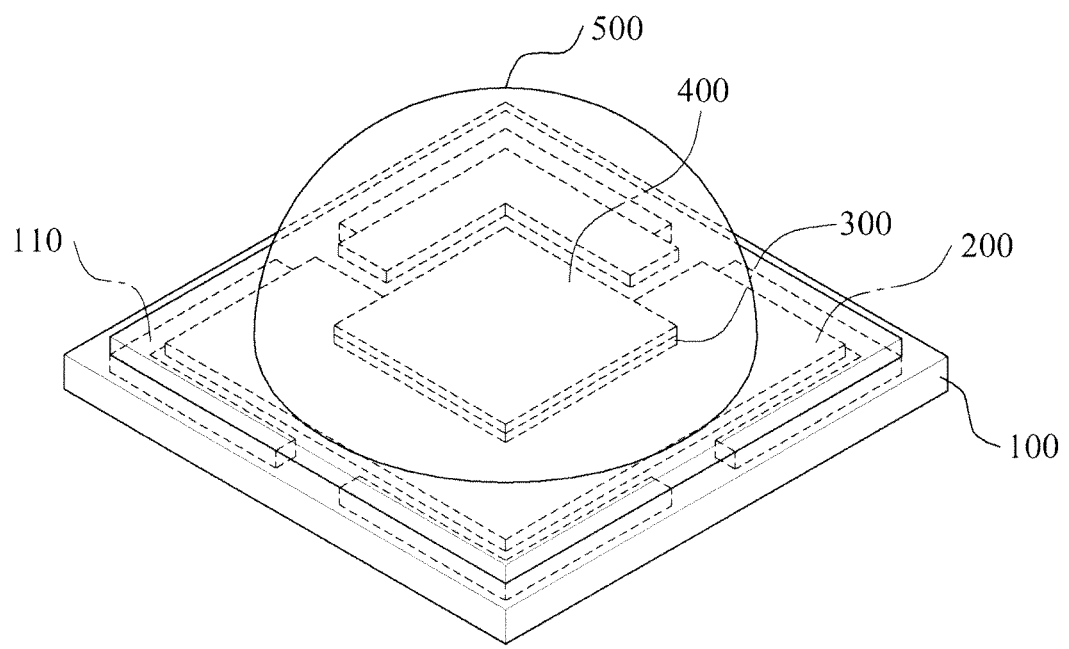
FIG. 1 is a perspective view of a light emitting diode (LED) module according to some embodiments of the present disclosure.

Exemplary embodiments of the present disclosure will be described below in more detail with reference to the accompanying drawings. The embodiments of the present disclosure may, however, be embodied in different forms and should not be construed as limited to the embodiments set forth herein. Like reference numerals may refer to like elements throughout the specification.

In the drawings, the thickness of layers and regions may be exaggerated for clarity. It will also be understood that when an element such as a layer, region or substrate is referred to as being "on" or "onto" another element, it may lie directly on the other element or intervening elements or layers may also be present.

Hereinafter, referring to the drawings, the embodiments of the present disclosure will be described in further detail.

Figure 2:
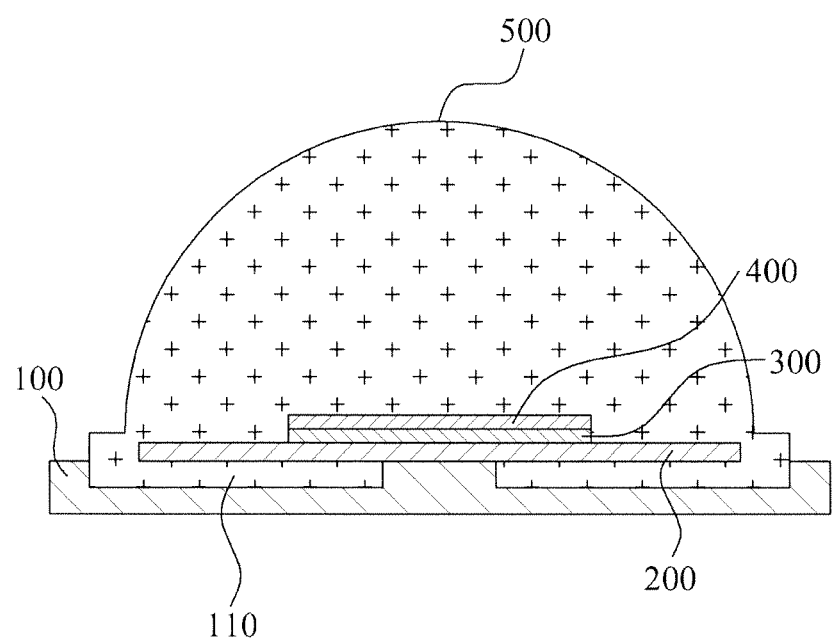
FIG. 2 is a sectional view of the LED module shown in FIG. 1.

FIG. 1 is a perspective view of a light emitting diode (LED) module according to some embodiments of the present disclosure. FIG. 2 is a sectional view of the LED module shown in FIG. 1.

Referring to FIGS. 1 and 2, the LED module includes a substrate 100, an electrode 200, an LED 300, a phosphor layer 400, and a lens 500.

The substrate 100 may be made of metal, silicone, or ceramic. The substrate 100 may be made of a material having excellent heat radiation characteristics. Referring to FIGS. 1 and 2, the substrate 100 includes a recess 110. The recess 110 will be described in further details in relation to a fastening structure of the lens 500.

The electrode 200 may be disposed on the substrate 100. In particular, the electrode 200 may be disposed on a plane surface of the substrate 100, not on the recess 110 formed on the substrate 100. That is, the electrode 200 may be disposed to prevent overlapping of the recess 110. The electrode 200 may include an electrical circuit to apply power to the LED 300.

The LED 300 is mounted on the electrode 200. The LED 300 may be mounted by a flip-chip bonding method that uses solder or a conductive adhesive. That is, the LED 300 may be flip-chip bonded to the substrate 100. Besides the flip-chip bonding, the LED 300 may be mounted on the substrate 100 by a die bonding or a wire bonding.

When the LED module is manufactured by the chip-on-board (COB) method according to an embodiment of the present disclosure, a flip chip on module (FCOM) method may be used such that the LED 300 is mounted on the substrate 100 in a flip-chip manner without using the wire bonding for electrical connection between the LED 300 and the substrate 100. When the LED 300 is mounted using the FCOM method, since the LED 300 is mounted in the flip-chip manner, high density mounting of the LED 300 on the substrate 100 may be achieved. Also, a module size may be reduced.

The LED 300 may be mounted on the electrode 200 using a bump (not separately shown). The bump (not separately shown) may be formed of a metallic material or a material having excellent heat radiation characteristics. By forming the substrate 100 and the bump (not separately shown) of the material having excellent heat radiation characteristics, such as metal and ceramic, heat radiation characteristics of the LED module may be increased.

The LED 300 will be briefly described. The LED 300 may include a first conductive type semiconductor layer, an active layer, a second conductive type semiconductor layer, and electrodes. The first conductive type semiconductor layer (not separately shown) may be n-doped. Electrons are moved to the active layer through the first conductive type semiconductor layer.

The active layer (not separately shown) is disposed on the first conductive type semiconductor layer. The active layer may have a laminated structure including a quantum barrier layer and a quantum well layer alternately deposited, so that electrons and holes recombine, and emit light. Composition of the active layer may be varied according to a desired light emission wavelength.

The second conductive type semiconductor layer (not separately shown) may be disposed on the active layer. The second conductive type semiconductor layer may be p-doped. The holes are moved to the active layer through the second conductive type semiconductor layer.

A transparent electrode (not separately shown) may be disposed on the second conductive type semiconductor layer. The transparent electrode may be a transparent layer of metal such as nickel (Ni) or gold (Au). Also, the transparent electrode may be made of a conductive oxide such as indium tin oxide (ITO). A p-type electrode (not separately shown) is disposed on the transparent electrode. An n-type electrode (not separately shown) is disposed on the first conductive type semiconductor layer. The p-type electrode and the n-type electrode may be made of various metals such as titanium (Ti) and aluminum (Al).

The holes are supplied through the p-type electrode while the electrons are supplied through the n-type electrode. The supplied holes and electrons combine at the active layer, thereby generating light energy. An ultraviolet (UV) LED or a blue LED may be achieved according to a wavelength of emitted light.

Referring to FIGS. 1 and 2, the phosphor layer 400 is disposed on the LED 300. The phosphor layer 400 may be disposed on a portion of a surface of the LED 300 or the entirety of the surface of the LED 300. The phosphor layer 400 may surround the LED 300. Light emitted from the LED 300 may pass through the phosphor layer 400 and advance toward the lens 500.

The phosphor layer 400 may scatter and thereby color-convert the light emitted from the LED 300. For example, a blue light from the LED 300 may be converted to yellow, green, or red light by passing through the phosphor layer 400. As a result, white light may be emitted to the outside environment.

The phosphor layer 400 may include a phosphor for converting blue light to yellow, green, or red light. The phosphor material 400 may include a host material and an active material. For example, the host material may be yttrium aluminum garnet (YAG) and the active material may be cerium. Alternatively, the phosphor material 400 may include a silicate-based host material and europium (Eu) as the active material. However, the materials of the phosphor layer 400 are not specifically limited.

The phosphor layer 400 may have a uniform and small thickness. Phosphor particles may be evenly distributed in the phosphor layer 400. Therefore, the light passed through the phosphor layer 400 may be uniformly color-converted. In addition, since the phosphor layer 400 has a uniform plane surface, the phosphor particles around the LED 300 may be uniformly distributed and, additionally, design of an optical system may be facilitated by surface emission.

The light emitted from the LED 300 may be emitted to the outside environment through the lens 500 after passing through the phosphor layer 400. An upper portion of the lens 500 may have a refractive surface which is convex in a direction of emitting incident light. The upper portion of the lens 500 may have a particular radius of curvature to adjust a view angle of the light being emitted to the outside environment.

The lens 500 may be formed directly on the substrate 100 or, alternatively, may be separately formed and disposed in the recess 110 formed at the substrate 100. That is, the lens 500 may be formed directly on the substrate 100 by injecting a lens forming material, or may be separately formed and fastened to the substrate 100 through the recess 110. The lens 500 may be made of silicone or the like. The lens 500 may be fastened to the substrate 100 using the recess 110 formed at the substrate 100.

The recess 110 may be plural in number. The plurality of recesses 110 may be disposed to prevent overlapping of the electrode 200. Here, the recesses 110 may be formed after the electrode 200 is formed on the substrate 100. Alternatively, after the recesses 110 are formed on the substrate 100, the electrode 200 may be deposited.

Figure 3:
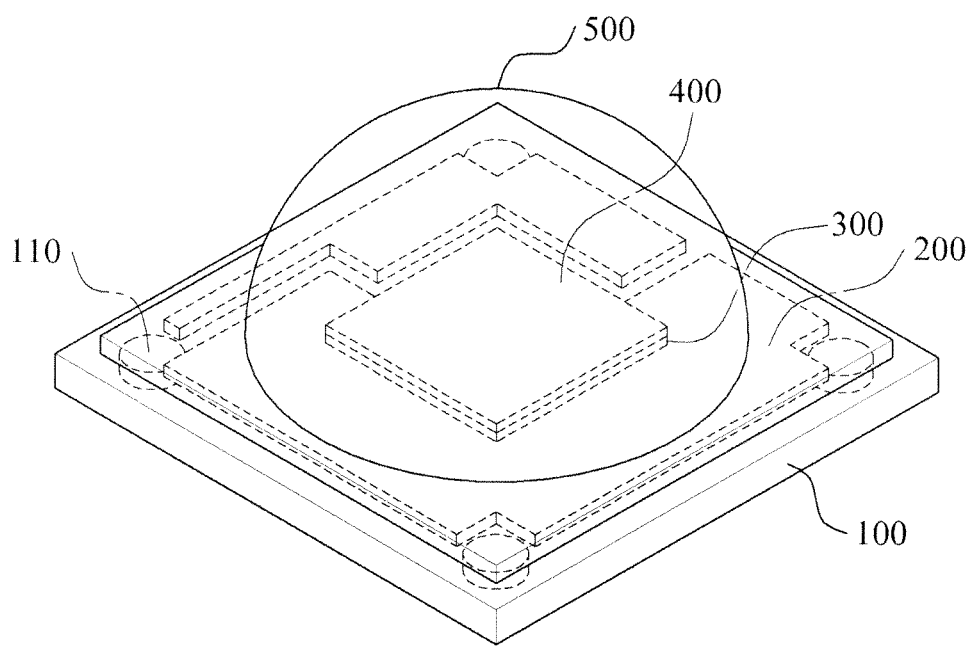
FIG. 3 is a perspective view of an LED module according to some embodiments of the present disclosure.
Figure 4:
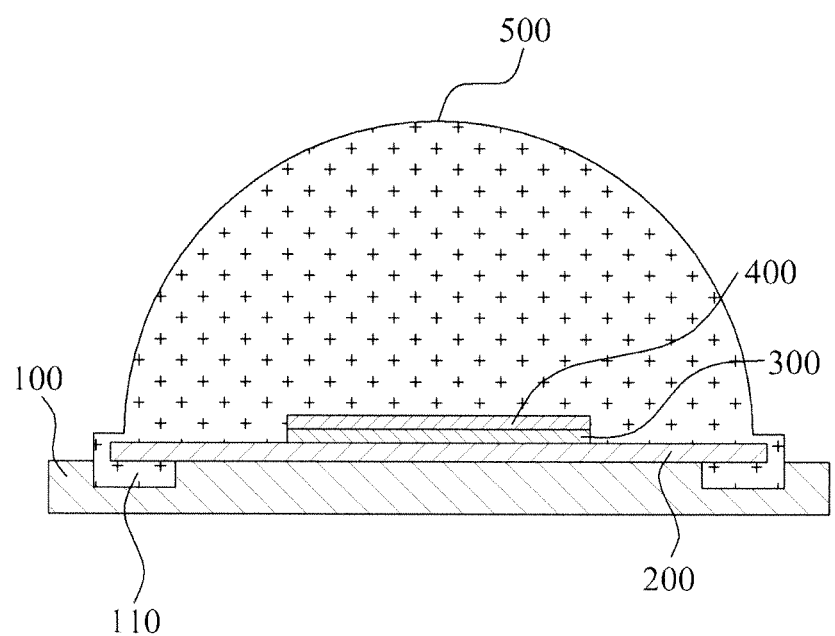
FIG. 4 is a sectional view of the LED module shown in FIG. 3.
Figure 5:
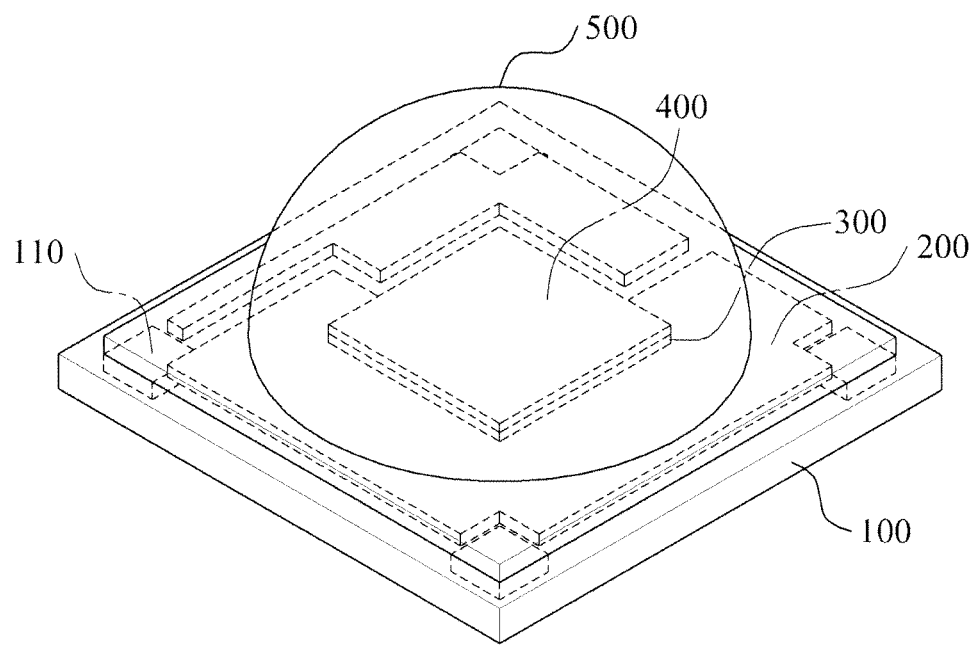
FIGS. 5 and 6 are perspective views of an LED module according to some embodiments of the present disclosure.

The plurality of recesses 110 may be disposed at corners of the substrate 100. As shown in FIGS. 1 to 5, the plurality of recesses 110 may be formed in various configurations at the corners. That is, the plurality of recesses 110 may be provided in a polygonal shape such as a triangle or a rectangle as shown in FIG. 5, or a circular shape as shown in FIG. 3 or 4. Also, the plurality of recesses 110 may have an L-shape as shown in FIG. 1 or 2, or an inverse L-shape according to a viewpoint. Since the plurality of recesses 110 are provided to fasten the lens 500, any other shape may be applied as long as facilitating the fastening to prevent the lens 500 from being escaped from the substrate 100.

Figure 6:
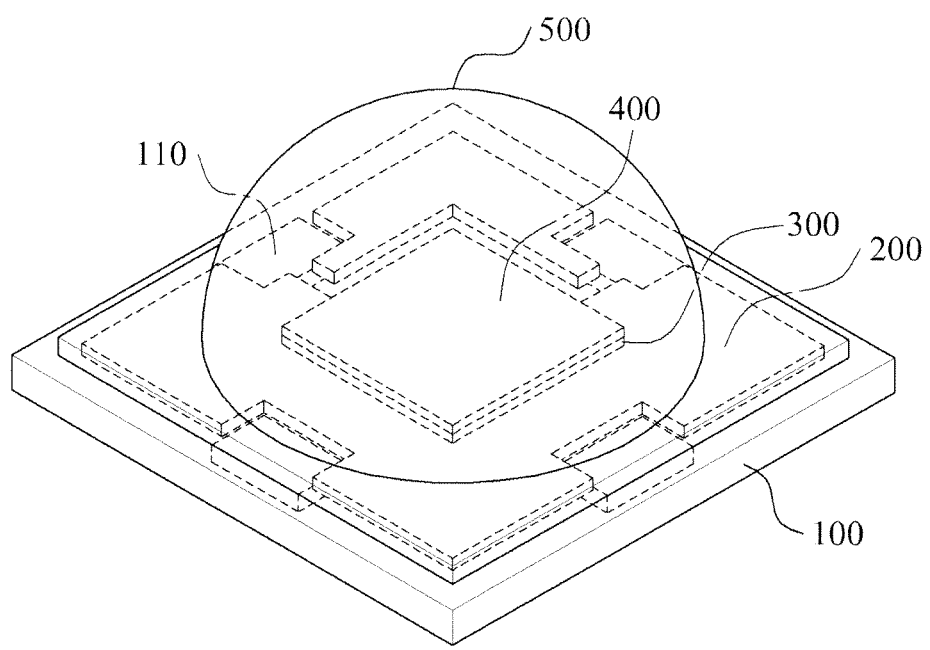

In addition, the plurality of recesses 110 may be disposed along edges of the substrate 100 as shown in FIG. 6. The plurality of recesses 110 disposed along edges of the substrate 100 may be provided in various shapes such as a rectangle and a square.

The plurality of recesses 110 may be provided in identical shapes or different shapes. That is, as long as the lens 500 is securely fastened, the plurality of recesses 110 may have any shape, diameter, depth, and the like. Furthermore, the plurality of recesses 110 may be disposed to prevent overlapping of the electrode 200.

Fastening between the lens 500 and the substrate 100 through the recess 110 may be performed as the recess 110 is filled with the lens forming material. In addition, as described in the foregoing, the lens 500 may be separately formed and then disposed in the recess 110 formed at the substrate 100. That is, the lens 500 may be formed directly on the substrate 100 by injecting the lens forming material in the recess 110. Alternatively, the lens 500 may be separately formed and then fastened to the substrate 100 through the recess 110 filled with the lens forming material.

Hereinafter, a method of manufacturing an LED module according to an example embodiment of the present disclosure will be described.

FIGS. 7A to 7E are diagrams illustrating a manufacturing method for an LED module according to an example embodiment of the present disclosure.

The LED module manufacturing method may include forming a recess 110 on a substrate 100, mounting an LED 300 on the substrate 100, forming a phosphor layer 400 surrounding the LED 300, and forming a lens 500 directly on the substrate 100 such that the lens 500 is fastened to the substrate 100 through the recess 110.

Figure 7A:
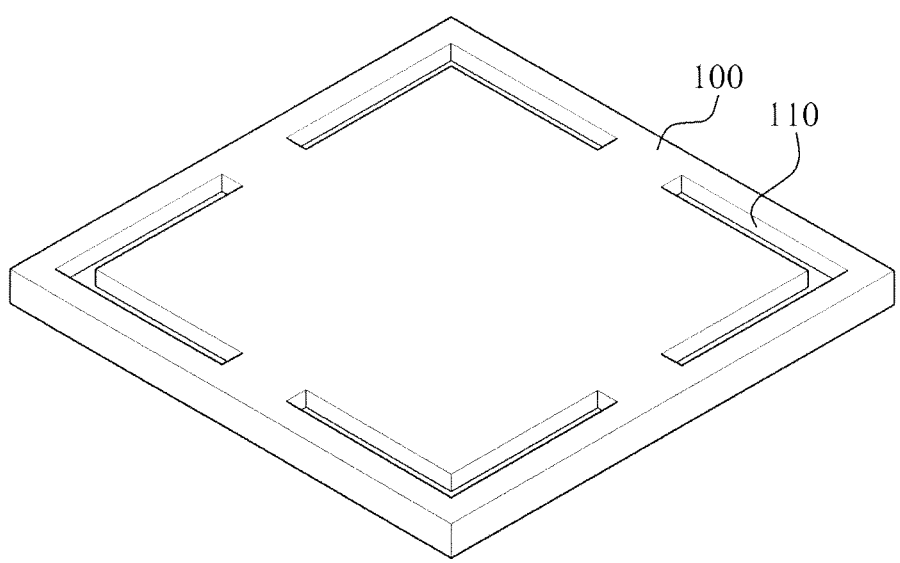
FIGS. 7A to 7E are diagrams illustrating a manufacturing method for an LED module according to some embodiments of the present disclosure.
Figure 7B:
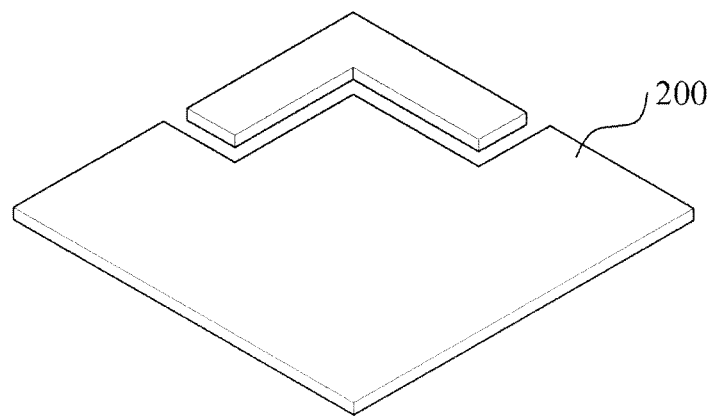
Figure 7C:
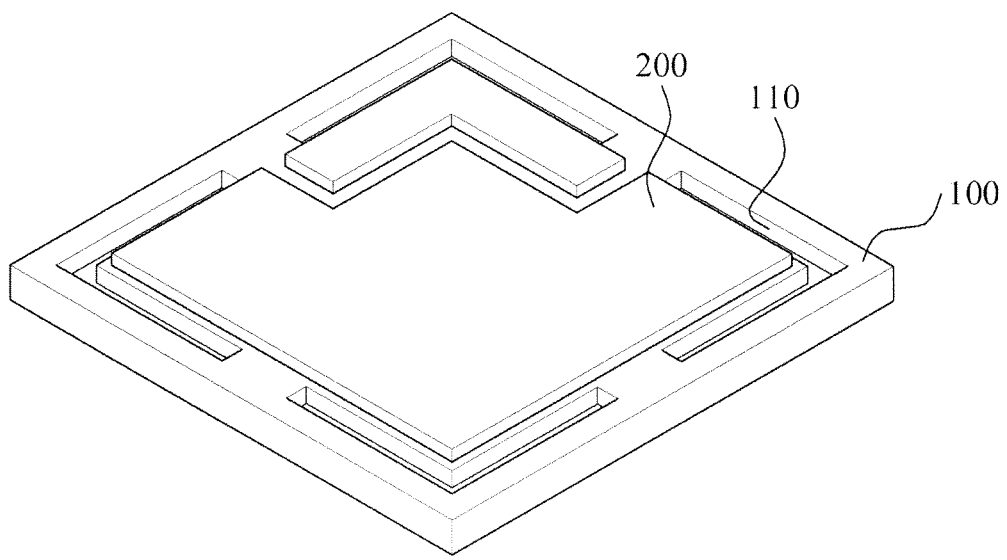

First, the substrate 100 formed with the recess 110 is prepared (see FIG. 7A) and the electrode 200 is deposited on the substrate 100 to prevent overlapping of the recess 110 (see FIG. 7C). Alternatively, after the electrode 200 may be deposited on the substrate 100 first (see FIG. 7B), the recess 110 may be formed to prevent overlapping of the electrode 200 (see FIG. 7C). The electrode 200 may be disposed on a plane surface of the substrate 100 without overlapping the recess 110 formed on the substrate 100.

A plurality of the recesses 110 may be provided. The plurality of recesses 110 may be disposed along edges of the substrate 100 or at corners of the substrate 100. Since the arrangement of the recesses 110 is described the foregoing, a detailed description will be omitted for conciseness.

Figure 7D:
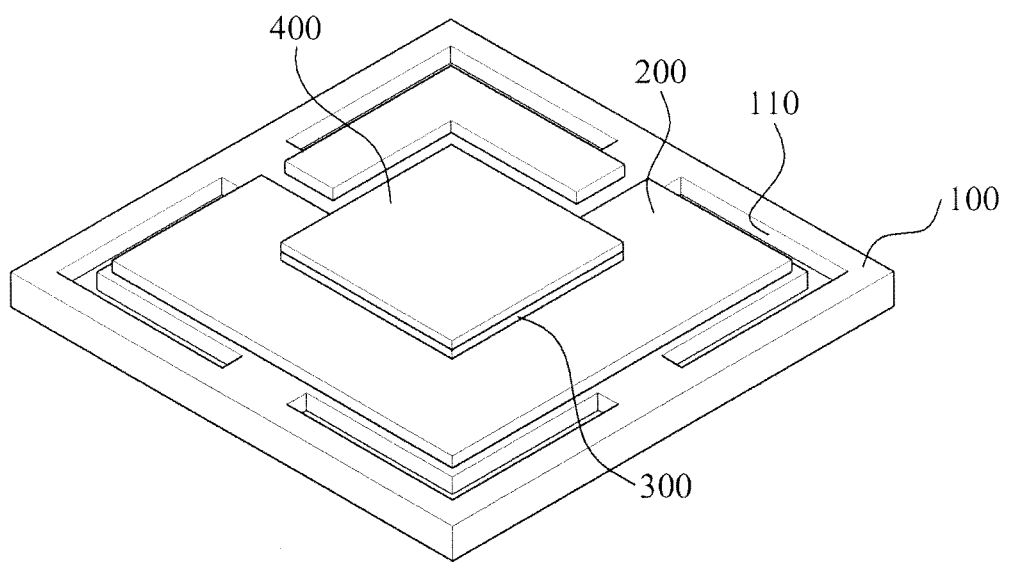

Next, referring to FIG. 7D, the LED 300 is mounted on the electrode 200 in various methods. For example, a bump (not separately shown) or a conductive adhesive (not separately shown) may be used to mount the LED 300.

When the LED module is manufactured by the COB method according to an embodiment of the present disclosure, the FCOM method may be used in which the LED 300 is mounted on the substrate 100 in a flip-chip manner without using a wire bonding for electrical connection between the LED 300 and the substrate 100. When the LED 300 is mounted in the FCOM method, since the LED 300 is mounted in the flip-chip manner, a high density mounting of the LED 300 on the substrate 100 may be achieved. Also, a module size may be reduced.

Next, referring to FIG. 7D, the phosphor layer 400 is formed on the LED 300. The phosphor layer 400 may be formed to have a uniform and small thickness and to surround an entire part of the LED 300. The phosphor layer 400 may be formed on a portion of a surface of the LED 300 or the entirety of the surface of the LED 300. Since the phosphor layer 400 is thin and uniform, the phosphor particles around the LED 300 may be uniformly distributed. Additionally, the light emitted from the LED 300 may be uniformly color-converted.

Figure 7E:
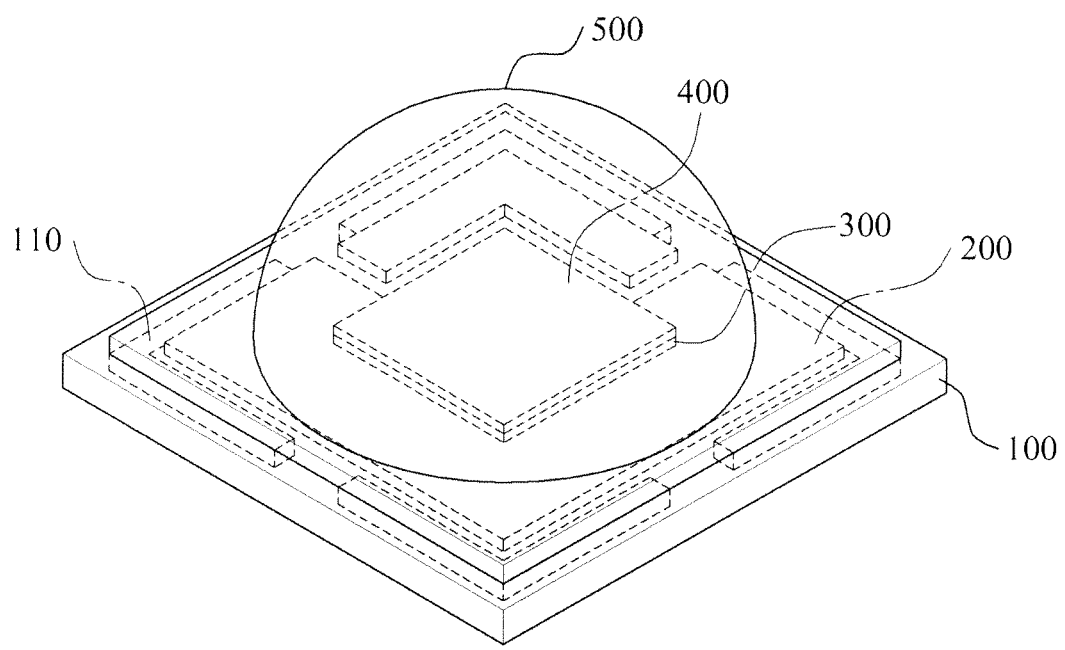

After the phosphor layer 400 is formed, referring to FIG. 7E, the lens 500 may be formed directly on the substrate 100. The lens 500 may be formed of silicone or the like. Compression molding or transfer molding may be used to form the lens 500 directly on the substrate 100.

The compression molding uses a mold and a press that applies heat and pressure. According to the compression molding, a lens forming material is applied on an overall surface of the substrate. Therefore, when an electrical connection of the LED module is necessary, the lens forming material may be removed from a position corresponding to the electrical connection.

The compression molding involves the following steps. The mold is disposed on the substrate on which the LED 300 and the phosphor layer 400 are formed. Next, the lens forming material is injected in an upper surface of the substrate 100 and an overall surface of the mold and then firstly heat-cured. Next, the mold is removed and the lens forming material is secondly heat-cured. The lens forming material may be partially removed from the position corresponding to the electric connection. Thus, the lens 500 is formed.

According to the transfer molding, after the lens forming material is forced into a hermetic heating mold, the lens forming material having plasticity is cured during transfer. The transfer molding is similar to the compression molding but is more appropriate for a complicated shape or a fragile insert that cannot apply general compression molding. In addition, the transfer molding may achieve uniform quality and accurate measure of respective parts of the molded product.

Therefore, in the operation of forming the lens 500 according to the embodiment of the present disclosure, the lens forming material may be fastened to the substrate 100 by filling the recesses 110. That is, during the forming of the lens 500, the lens forming material may fill the recesses 110 defined at corners or along edges of the substrate 100. Accordingly, since the forming of the lens 500 and the filling the recesses 110 are performed simultaneously, high adhesion between the substrate 100 and the lens 500 may be achieved without using a dedicated adhesive and the like, thereby simplifying the manufacturing process and reducing the cost.

Since fastening between the substrate 100 and the lens 500 is achieved by filling the recesses 100 with the lens forming material, the adhesion between the lens 500 and the substrate 100 may be increased. Also, since a gap is not generated between the lens 500 and the substrate 100, high adhesion may be achieved as if the substrate 100 and the lens 500 were integrally formed.

Alternatively, according to another embodiment of the present disclosure, the lens 500 may be formed separately, and disposed on the substrate 100. The lens forming material may then be fastened to the substrate 100 by filling the recesses 110. That is, the lens forming material may fill the recesses 110 defined at corners or along edges of the substrate 100 to fasten the lens 500 to the substrate 100.

Thus, according to the embodiments of the present disclosure, a substrate and a lens are fastened to each other by filling recesses with a lens forming material without a dedicated adhesive. Furthermore, since the lens does not easily escape by an external shock, reliability of the LED module may be increased.

The LED module according to an embodiment of the present disclosure includes the substrate formed with the recesses, and a lens fastened to the substrate through the recesses. Accordingly, escape of the lens from the substrate may be prevented. For example, during forming of the lens, the lens forming material fills the recesses so that the substrate and the lens are fastened to each other. Thus, the lens may be attached to the substrate without a dedicated adhesive. Also, since the lens is not easily separated by an external shock, reliability of the LED module may be increased.

Moreover, according to an embodiment of the present disclosure, since the lens is formed directly on the substrate by the COB method, the manufacturing cost may be reduced. In addition, heat radiation efficiency may be increased by shortening a heat transfer path.

Although embodiments of the present disclosure have been shown and described, it will be appreciated by those skilled in the art that changes may be made without departing from the principles and spirit of the present disclosure, the scope of which is defined in the appended claims.

What is claimed is:

1. A light emitting diode (LED) module, comprising:
a substrate having a recess defined therein such that the recess extends along edges of the substrate;
an electrode disposed on the substrate;
an LED disposed on the substrate;
a phosphor layer disposed on the LED; and
a lens disposed on the substrate and fastened to the substrate through the recess,
wherein the lens is in contact with a surface of the recess and with the electrode.

2. The LED module of claim 1, wherein a plurality of the recesses are defined on the substrate.

3. The LED module of claim 2, wherein the plurality of recesses extend along edges of the substrate.

4. The LED module of claim 2, wherein the plurality of recesses are defined at corners of the substrate.

5. The LED module of claim 2, wherein the plurality of recesses have an identical shape.

6. The LED module of claim 2, wherein the plurality of recesses have different shapes.

7. The LED module of claim 2, wherein each of the plurality of recesses has a polygonal shape, an L-shape, or a circular shape.

8. The LED module of claim 1, wherein:
the recess is filled with a lens forming material, and
the lens is fastened to the substrate with the lens forming material filling the recess.

9. The LED module of claim 1, wherein the phosphor layer surrounds the LED.

10. A manufacturing method for a light emitting diode (LED), comprising steps of:
forming a recess in a substrate to extend along edges of the substrate;
mounting an electrode on the substrate;
mounting an LED on the substrate;
forming a phosphor layer on the LED; and
forming a lens directly on the substrate by applying a lens forming material on the substrate such that the lens is fastened to the substrate through the recess,
wherein the lens is in contact with a surface of the recess and with the electrode.

11. The manufacturing method of claim 10, further comprising a step of:
forming a plurality of the recesses in the substrate, the plurality of recesses extending along edges of the substrate.

12. The manufacturing method of claim 10, further comprising a step of:
forming a plurality of recesses in the substrate at corners of the substrate.

13. The manufacturing method of claim 10, further comprising a step of:
filling the recess with the lens forming material such that the lens is fastened to the substrate with the lens forming material filling the recess.

14. The manufacturing method of claim 10, wherein the step of forming the lens includes performing the forming the lens and filling the recess with the lens forming material, simultaneously, such that the lens is fastened to the substrate with the lens forming material filling the recess.

15. The manufacturing method of claim 10, wherein the phosphor layer surrounds the LED.

* * * * *